United States Patent
Rainbow

(10) Patent No.: US 10,912,196 B2
(45) Date of Patent: Feb. 2, 2021

(54) POWER DISTRIBUTION ASSEMBLY

(71) Applicant: GE Aviation Systems Limited, Gloucestershire (GB)

(72) Inventor: Alexander James Rainbow, Swindon (GB)

(73) Assignee: GE Aviation Systems Limited, Gloucestershire (GB)

(*) Notice: Subject to any disclaimer, the term of this patent is extended or adjusted under 35 U.S.C. 154(b) by 0 days.

(21) Appl. No.: 16/325,403

(22) PCT Filed: Aug. 15, 2017

(86) PCT No.: PCT/EP2017/070658
§ 371 (c)(1),
(2) Date: Feb. 14, 2019

(87) PCT Pub. No.: WO2018/041625
PCT Pub. Date: Mar. 8, 2018

(65) Prior Publication Data
US 2019/0215961 A1    Jul. 11, 2019

(30) Foreign Application Priority Data
Sep. 2, 2016  (GB) .................................. 1614936.1

(51) Int. Cl.
*H05K 1/14*    (2006.01)
*H01R 12/52*   (2011.01)
(Continued)

(52) U.S. Cl.
CPC ........... *H05K 1/144* (2013.01); *H01R 12/523* (2013.01); *H01R 12/73* (2013.01);
(Continued)

(58) Field of Classification Search
None
See application file for complete search history.

(56) References Cited

U.S. PATENT DOCUMENTS 4,694,123 A   9/1987  Massey
6,191,954 B1  2/2001  Keidl et al.
(Continued)

FOREIGN PATENT DOCUMENTS

CN   1222824 A     7/1999
CN   103477724 A   12/2013
(Continued)

OTHER PUBLICATIONS

Great Britain Search Report and Written Opinion dated Jan. 11, 2017 which was issued in connection with GB1614936.1 which was filed on Sep. 2, 2016.
(Continued)

*Primary Examiner* — Xanthia C Cunningham
(74) *Attorney, Agent, or Firm* — McGarry Bair PC

(57) ABSTRACT

A power distribution assembly includes a printed circuit board (PCB) having a power input and electrical components connected to PCB conductive trace. A power bus extends from the PCB and has a conductive core, a dielectric layer on an exterior surface of the conductive core, a conductive trace on the dielectric layer, and a power cut through the dielectric layer to the conductive core. The conductive core is connected to the power input by way of the power cut through and the at least one second conductive trace is connected to the PCB conductive trace.

20 Claims, 3 Drawing Sheets

(51) Int. Cl.
*H01R 12/73* (2011.01)
*H05K 1/02* (2006.01)
*H05K 3/36* (2006.01)
*H04M 1/02* (2006.01)
*H05K 1/05* (2006.01)

(52) U.S. Cl.
CPC ........ *H04M 1/0262* (2013.01); *H05K 1/0262* (2013.01); *H05K 1/0263* (2013.01); *H05K 3/368* (2013.01); *H05K 1/0284* (2013.01); *H05K 1/05* (2013.01); *H05K 2201/042* (2013.01); *H05K 2201/048* (2013.01); *H05K 2201/10053* (2013.01); *H05K 2201/10166* (2013.01); *H05K 2201/10272* (2013.01)

(56) References Cited

U.S. PATENT DOCUMENTS

| | | | |
|---|---|---|---|
| 7,878,842 | B2 | 2/2011 | Jia et al. |
| 9,456,491 | B2 | 9/2016 | Peck et al. |
| 2001/0041548 | A1* | 11/2001 | Bult ................... H03F 3/195 455/252.1 |
| 2010/0195301 | A1 | 8/2010 | Fotherby |
| 2014/0211432 | A1 | 7/2014 | Lozano et al. |
| 2015/0069829 | A1* | 3/2015 | Dulle .................. H01M 2/22 307/9.1 |

FOREIGN PATENT DOCUMENTS

| | | |
|---|---|---|
| EP | 1119228 A2 | 7/2001 |
| WO | 2008044974 A1 | 4/2008 |

OTHER PUBLICATIONS

International Search Report and Written Opinion dated Nov. 8, 2017 which was issued in connection with PCT/EP2017/070658 which was filed on Aug. 15, 2017.
CN103477724A, U.S. Pat. No. 9,456,491B2.
CN1222824A, Machine Translation of Claims.
Chinese Patent Office, Office Action re Corresponding Application No. 201780053810.5, dated Nov. 4, 2020, 11 pages, China.

* cited by examiner

POWER DISTRIBUTION ASSEMBLY

BACKGROUND

Electrical power systems, such as those found in an aircraft power distribution system, employ power generating systems or power sources, such as generators, for generating electricity for powering the systems and subsystems of the aircraft. The electricity traverses electrical bus bars to deliver power from power sources to electrical loads, often by way of printed circuit boards (PCBs). Frequently, the PCB's also utilize signals to control the distribution of power from the bus bars as, for example, in switches. Signals are often conveyed in on a PCB and among different PCBs by way of tracks or traces laid down on dielectric materials apart from the bus bars.

BRIEF DESCRIPTION

In one aspect, a power distribution assembly includes one or more printed circuit boards (PCBs), each PCB having a power input and a component connected to a first conductive trace on the PCB. A power bus extends from the PCB, and has a conductive core, a dielectric layer on an exterior surface of the conductive core, a second conductive trace on the dielectric layer, and a power cut through the dielectric layer to the conductive core. The conductive core is connected to the power input by way of the power cut and the second conductive trace is connected to the first conductive trace.

In another aspect, power distribution assembly for an aircraft includes a power switch having a PCB with a power input and a component connected to a first conductive trace on the PCB. A power bus extends from the PCB, the power bus having a conductive core, a dielectric layer on an exterior surface of the conductive core, a second conductive trace on the dielectric layer, and a power cut through the dielectric layer to the conductive core. The conductive core is connected to the power input by way of the power cut and the second conductive trace is connected to the first conductive trace.

In yet another aspect, a method of integrating power and signaling in a power distribution assembly includes providing a PCB with a power input and at least one component connected to a first conductive trace on the PCB. The method also includes extending a power bus from the PCB, the power bus having a conductive core, a dielectric layer on an exterior surface of the conductive core, a second conductive trace on the dielectric layer, and a power cut through the dielectric layer to the conductive core, and connecting the conductive core to the power input by way of the power cut and the second conductive trace to the first conductive trace. Power conducted to the power input can be controlled by component in response to signaling conducted through the first conductive trace and the second conductive trace.

DETAILED DESCRIPTION

The described embodiments of the present invention are directed to a method and apparatus associated with a modular power distribution apparatus. One example environment where such a method and apparatus can be used includes, but is not limited to, a power distribution system for an aircraft. Aspects of the invention are also applicable to any environment using a nodal-based power distribution system where input power is received, acted upon (if necessary), e.g., converted or modified, and distributed to one or more electrical loads using signaling for switching, control, etc.

An aircraft, for example, has at least one gas turbine engine from which a power source, such as an electric machine or a generator, extracts power and distributes power to a set of power-consuming components, or electrical loads, such as for instance, an actuator load, flight critical loads, and non-flight critical loads. The electrical loads are electrically coupled with the power source via a power distribution system including, for instance, power transmission lines or bus bars.

Figure 1:
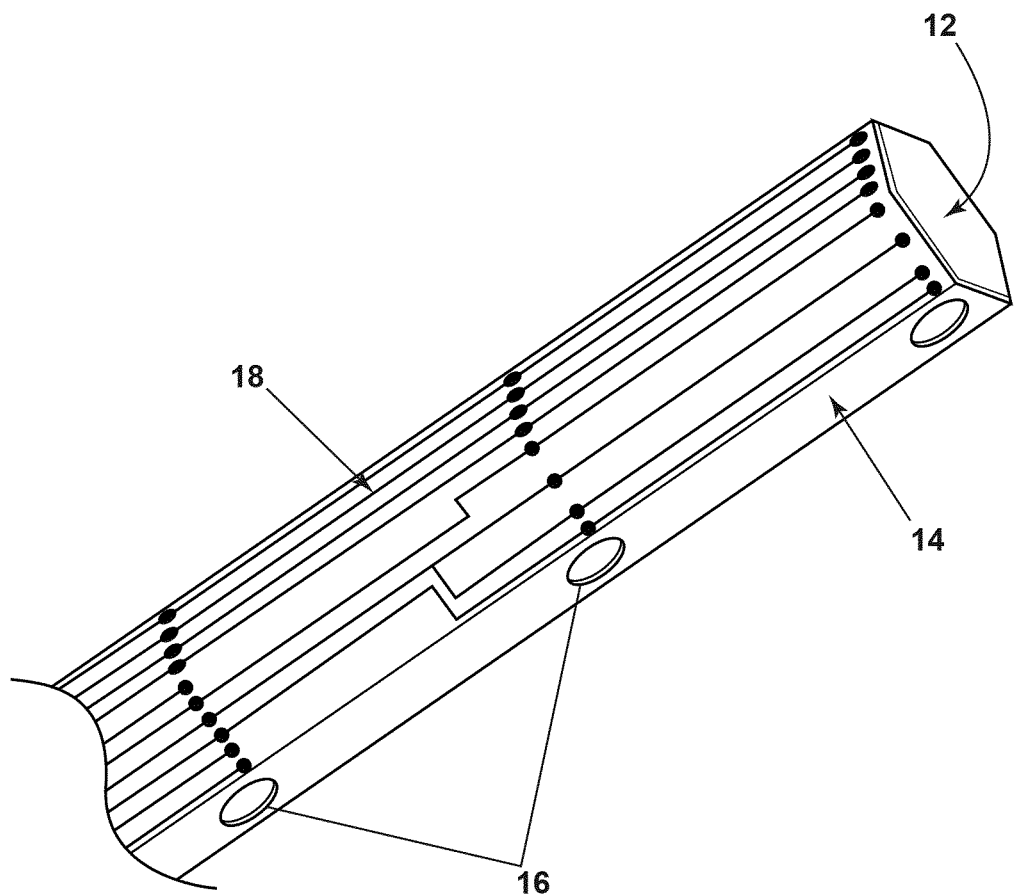
FIG. 1 is an isometric view of a portion of a bus bar in accordance with one aspect of the invention.

FIG. 1 illustrates an embodiment of a bus bar 10 according to an aspect of the invention. It will be understood that the power source may generate AC or DC power, which is then transmitted over the bus bar 10. The bus bar 10 comprises a conductive core 12, which is preferably solid copper. Typical power transmitted over the solid core 12 in an aircraft will be 270 V DC. The solid core 12 has at least one surface that is covered with a dielectric layer 14, such as an aluminate polymer or ceramic. Preferably, all surfaces of the solid core 12 are covered by the dielectric layer 14. A set of power cut throughs 16 expose the conductive core 12 through the dielectric layer 14 for a purpose explained hereinafter. Also, though the bus bar 10 can have any cross sectional shape, it will be seen that the bus bar 10 preferably has a non-circular cross section, here shown as hexagonal.

A set of conductive traces 18 is disposed on the dielectric layer 14. The conductive traces may be formed by plating and then etching to the dielectric layer 14, or by any other technique commonly known for laying down conductive traces on a dielectric substrate. The conductive traces 18 are arranged with connections and nodes as necessary for delivery of low voltage control signals, typically on the order of 30 V DC in an aircraft.

Figure 2:
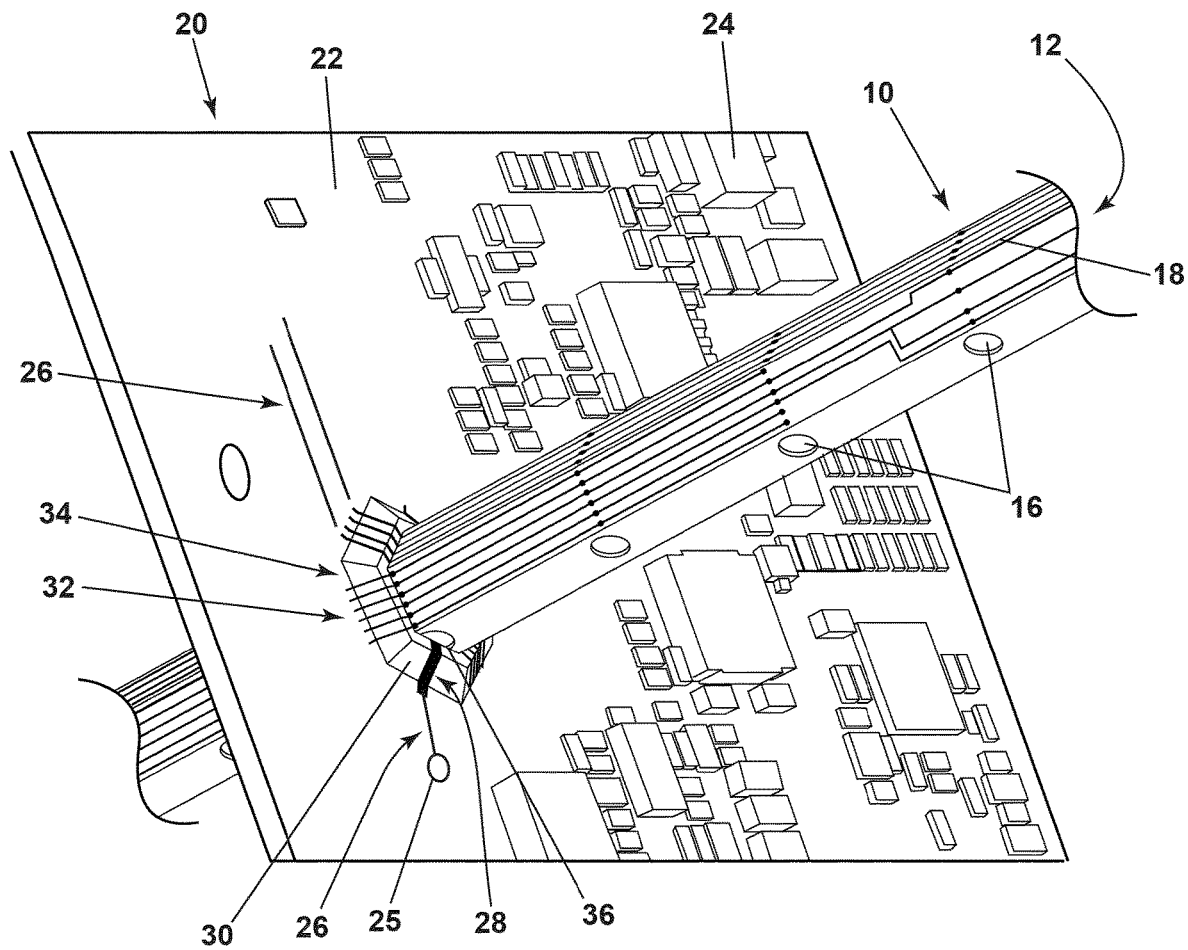
FIG. 2 is an isometric view of the bus bar of FIG. 1 connected to a printed circuit board, in accordance with an aspect of the invention.

Looking now at FIG. 2, one can see an interface between the bus bar 10 and a printed circuit board (PCB) 20. The PCB comprises a dielectric substrate 22 that carries a set of electrical components 24 arranged and configured for any of a number of functions as needed by the aircraft. A set of PCB conductive traces 26 provide connections to and among the electrical components 24, one of which may be a power input 25. An exemplary function of the electrical components 24 is a power switching function that directs and switches power transmitted by the bus bar 10 to any of a set of loads in the aircraft. The dielectric substrate 22 has an aperture 28 extending there through, shaped to match the cross sectional shape of the bus bar 10. A through board connector 30 surrounds the aperture 28 and engages the bus bar 10 to provide a path for connections between the conductive traces 18 and the power cut throughs 16 on the bus bar 10 on the one hand and the PCB conductive traces 26 and electrical components 24 on the other hand. Leaf connections 32 provide the respective connections, wherein a signaling subset of leaf connections 34 couples the conductive traces 18 on the bus bar 10 to the PCB conductive traces 26 that direct signals to the electrical components 24, and a power subset of leaf connections 36 couples the solid core 12 to the PCB conductive traces 26, preferably the power input 25, that directs power to a load. A non-circular cross section of the bus bar 10 can ensure that leaf connections 32 are maintained and not compromised by rotation of the bus bar 10 relative to the PCB 20.

Figure 3:
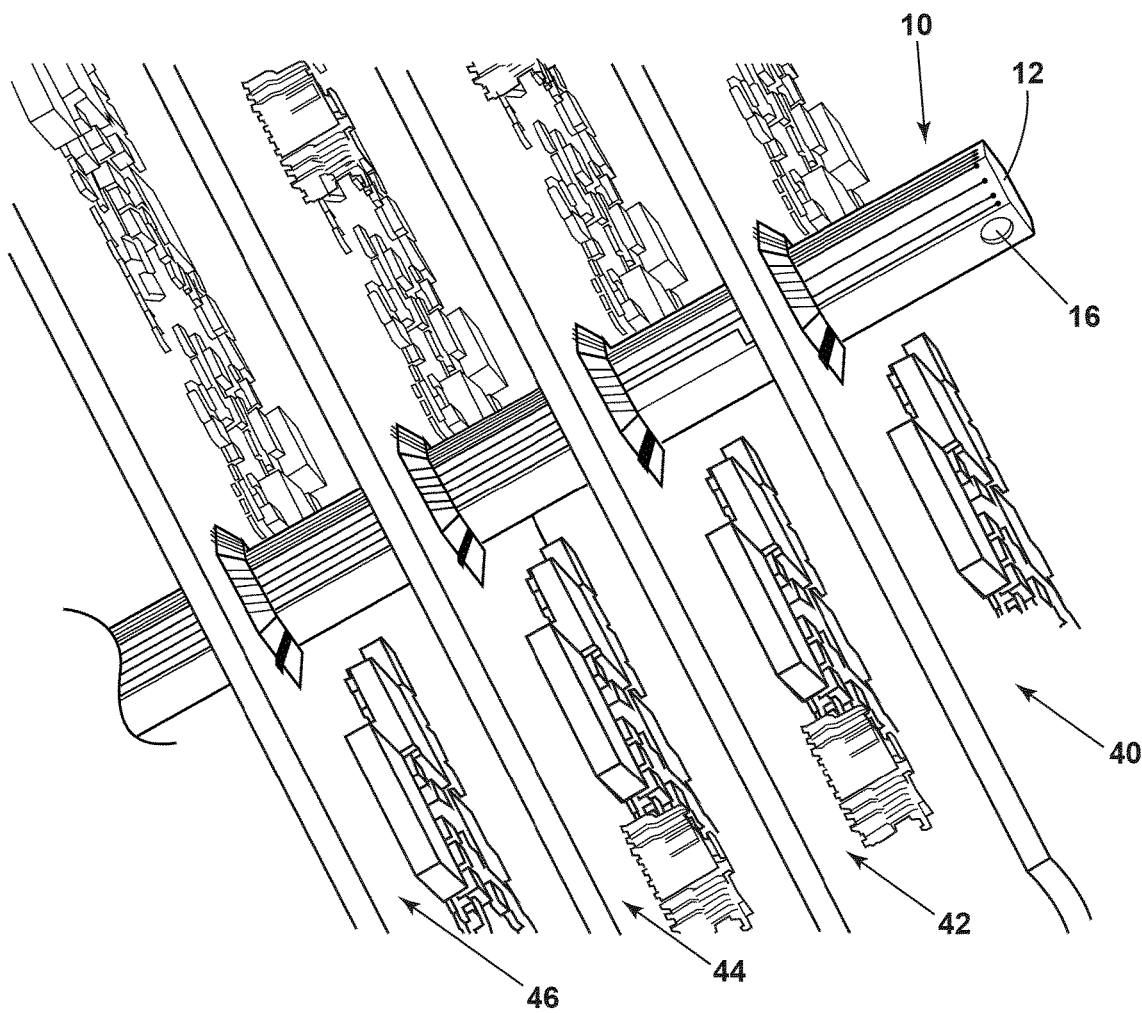
FIG. 3 is an isometric view of the bus bar of FIG. 1 connected to a plurality of PCBs in accordance with an aspect of the invention.

FIG. 3 illustrates a set of PCB's 40, 42, 44, 46, each connected to a single bus bar 10, and each having a distinct and different set of electrical components. Different sets of the conductive traces 18 on the bus bar 10 are connected to and between the set of PCBs, so that sets of electrical components on different PCBs can communicate with each other via the conductive traces 18. One or more PCBs 40, 42, 44, or 46 is coupled to the solid core 12 via one or more power cut throughs 16 for each PCB to enable delivery of power to electrical loads. A non-circular cross section of the bus bar 10 can ensure that leaf connections 32 are maintained and not compromised by rotation of the bus bar 10 relative to any of the PCBs 40, 42, 44, 46.

Circuitry may be provided on a PCB or elsewhere to filter out interference between signals being transmitted on the conductive traces 18 and power conveyed on the solid core 12. A common control module or processor (not shown) can be configured to control effective operation of the distribution of power and signaling over the bus bar 10, including any interference circuitry. For example if the PCBs 40, 42, 44, 46 are switching modules to selectively enable or disable a supply of power from the solid core 12 to an electrical load, the common control module or processor can selectively operate the respective switching modules by way of signaling over the conductive traces 18 while the bus bar 10 simultaneously delivers power over the solid core 12.

The embodiments disclosed herein provide a method and apparatus for distributing power and signaling simultaneously over a single bus bar. Advantages that can be realized in the above embodiments is reduction in weight from having fewer connecting components, simplified connections, less volume required than the prior art saving space, parallel connections that reduce the impact of failure in an one electrical component or PCB, robustness of design, scalability, flexibility of form, and integral strength in PCB stacks.

To the extent not already described, the different features and structures of the various embodiments may be used in combination with each other as desired. That one feature may not be illustrated in all of the embodiments is not meant to be construed that it may not be, but is done for brevity of description. Thus, the various features of the different embodiments may be mixed and matched as desired to form new embodiments, whether or not the new embodiments are expressly described. All combinations or permutations of features described herein are covered by this disclosure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A power distribution assembly comprising:
   at least one printed circuit board (PCB) having a power input and a least one component connected to at least one first conductive trace on the PCB; and
   power bus extending from the at least one PCB, the power bus having a conductive core, a dielectric layer on an exterior surface of the conductive core, at least one second conductive trace on the dielectric layer, and a first opening through the dielectric layer to expose the conductive core;
   wherein the conductive core is connected to the power input by way of the first opening and the at least one second conductive trace is connected to the at least one first conductive trace.

2. The power distribution assembly of claim 1, wherein the dielectric layer is one of a polymer or a ceramic.

3. The power distribution assembly of either of claim 1, wherein the power bus extends through the at least one PCB to at least one other PCB having a second power input and a least one other component connected to at least one third conductive trace on the at least one other PCB, wherein the conductive core is connected to the second power input by way of a second opening through the dielectric layer and the at least one second conductive trace is connected to the at least one third conductive trace.

4. The power distribution assembly of claim 1, wherein the at least one PCB comprises an aperture extending therethrough, the aperture having a shape matching a cross-sectional shape of the power bus.

5. The power distribution assembly of claim 4, wherein the power bus has a hexagonal cross section.

6. The power distribution assembly of claim 1, wherein the conductive core is solid.

7. The power distribution assembly of claim 1, wherein the conductive core is configured to conduct current at 270 VDC and the at least one second conductive trace is configured to conduct current at 30 VDC.

8. The power distribution assembly of claim 1, further comprising circuitry to minimize interference between current conducted on the conductive core and current conducted on the at least one second conductive trace.

9. The power distribution assembly of claim 1, wherein the at least one second conductive trace is formed by plating and etching the dielectric layer.

10. A power distribution assembly for an aircraft comprising:
    a power switch having at least one printed circuit board (PCB) having a power input and a least one component connected to at least one first conductive trace on the PCB; and
    a power bus extending from the at least one PCB, the power bus having conductive core, a dielectric layer on an exterior surface of the conductive core, at least one second conductive trace on the dielectric layer, and a first opening through the dielectric layer to expose the conductive core;
    wherein the conductive core is connected to the power input by way of the first opening and the at least one second conductive trace is connected to the at least one first conductive trace.

11. The power distribution assembly of claim 10, wherein the dielectric layer is one of a polymer or a ceramic.

12. The power distribution assembly of either of claim 10, wherein the power bus extends through the at least one PCB to at least one other PCB having a second power input and a least one other component connected to at least one third conductive trace on the at least one other PCB, wherein the conductive core is connected to the second power input by way of a second opening through the dielectric layer and the at least one second conductive trace is connected to the at least one third conductive trace.

13. The power distribution assembly of claim 10, wherein the at least one PCB comprises an aperture extending therethrough, the aperture having a shape matching a cross-sectional shape of the power bus.

14. The power distribution assembly of claim 13, wherein the power bus has a hexagonal cross section.

15. The power distribution assembly of claim 10, wherein the conductive core is solid.

16. The power distribution assembly of claim 10, wherein the conductive core is configured to conduct current at 270 VDC and the at least one second conductive trace is configured to conduct current at 30 VDC.

17. The power distribution assembly of claim 10, further comprising circuitry to minimize interference between current conducted on the conductive core and current conducted on the at least one second conductive trace.

18. The power distribution assembly of claim 10, wherein the at least one second conductive trace is formed by plating and etching the dielectric layer.

19. A method of integrating power and signaling in a power distribution assembly comprising:

providing at least one printed circuit board (PCB) having a power input and at least one component connected to at least one first conductive trace on the PCB;

extending a power bus from the at least one PCB, the power bus having a conductive core, a dielectric layer on an exterior surface of the conductive core, at least one second conductive trace on the dielectric layer, and an opening through the dielectric layer to expose the conductive core; and connecting the conductive core to the power input by way of the opening and the at least one second conductive trace to the at least one first conductive trace;

wherein power conducted to the power input can be controlled by the least one component in response to signaling conducted through the at least one first conductive trace and the at least one second conductive trace.

20. The method of claim 19, performed in an aircraft.

* * * * *